(12) United States Patent
Tsai et al.

(10) Patent No.: US 11,406,018 B1
(45) Date of Patent: Aug. 2, 2022

(54) DOUBLE-SIDED AND MULTILAYER FLEXIBLE PRINTED CIRCUIT (FPC) SUBSTRATE AND METHOD OF PROCESSING THE SAME

(71) Applicant: Aplus Semiconductor Technologies Co., Ltd., Changzhou (CN)

(72) Inventors: Sui-Ho Tsai, Changzhou (CN); Cheng-Neng Chen, Changzhou (CN); Yun-Nan Wang, Changzhou (CN); Chih-Yuan Chao, Changzhou (CN); Hsueh-Tsung Lu, Changzhou (CN)

(73) Assignee: APLUS SEMICONDUCTOR TECHNOLOGIES CO., LTD., Changzhou (CN)

( * ) Notice: Subject to any disclaimer, the term of this patent is extended or adjusted under 35 U.S.C. 154(b) by 0 days.

(21) Appl. No.: 17/181,039

(22) Filed: Feb. 22, 2021

(51) Int. Cl.
*H05K 1/11* (2006.01)
*H05K 1/03* (2006.01)
*H05K 3/42* (2006.01)

(52) U.S. Cl.
CPC ........... *H05K 1/118* (2013.01); *H05K 1/0393* (2013.01); *H05K 1/115* (2013.01); *H05K 3/429* (2013.01); *H05K 2201/09854* (2013.01)

(58) Field of Classification Search
CPC ...... H05K 1/118; H05K 1/0393; H05K 1/115; H05K 3/429; H05K 2201/09854; H05K 2201/09836
See application file for complete search history.

(56) References Cited

U.S. PATENT DOCUMENTS

| 5,378,314 A * | 1/1995 | Schmidt ................. H05K 1/115 216/18 |
| 2013/0072012 A1* | 3/2013 | Tseng ..................... H05K 3/426 438/613 |
| 2013/0313010 A1* | 11/2013 | Rokugawa ........... H05K 1/0298 174/262 |
| 2018/0070443 A1* | 3/2018 | Leitgeb .................... H05K 3/42 |
| 2019/0206777 A1* | 7/2019 | Koller ................. H01L 21/4857 |

\* cited by examiner

*Primary Examiner* — Roshn K Varghese

(57) ABSTRACT

A double-sided and multilayer flexible printed circuit (FPC) substrate contains: a body, multiple tilted vias passing through the body, a sputtering layer, multiple conductive portions, and multiple copper circuit layers. The sputtering layer is adhered on the body and the multiple tilted vias. A respective conductive portion is formed in a respective titled via and is connected with the sputtering layer. The multiple copper circuit layers are located on a top and a bottom of the body and are connected with the sputtering layer, and the multiple copper circuit layers are connected via the multiple conductive portions.

2 Claims, 2 Drawing Sheets

DOUBLE-SIDED AND MULTILAYER FLEXIBLE PRINTED CIRCUIT (FPC) SUBSTRATE AND METHOD OF PROCESSING THE SAME

FIELD OF THE INVENTION

The present invention relates to a technology of processing a substrate, and more particularly to a double-sided and multilayer FPC substrate and a method of processing the same.

BACKGROUND OF THE INVENTION

A flexible printed circuit (FPC) is made of polyimide or polyester film to have a high reliability and flexibility, and the FPC has high wiring density, compact weight, and thin thickness.

Chip On Flex (COF) or Chip On Film (COF) is applied to fix a drive integrated circuit (IC) on a chip of a flexible circuit board, wherein a substrate is flexible and is configured to carry and adhere the chips with the flexible circuit board, and the COF is capable of obtaining high accuracy of FPC.

Conventional methods of making a double-sided and multilayer FPC substrate contains:

1. A modified-semi-additive process (mSAP) having steps of drilling conductive vias, cleaning vias, shadowing, press molding, exposing, projecting, copper electroplating, eliminating film, removing copper/Tiecoat, and inspecting a circuit.

2. A etching method having steps of: drilling conductive vias, cleaning vias, shadowing, copper electroplating, pretreatment, pressing molding, exposing, projecting/etching/removing film, and inspecting a circuit.

It is necessary to purchase FPC substrates and copper foils and to drill multiple vertical vias. However, it has higher purchase cost of the FPC substrates and copper foils than insulated substrates. In addition, a copper layer is covered on the copper foil of the FPC substrate, and drilling the multiple vertical vias will consume high laser energy, thus causing low drilling efficiency, deformation of FPC substrate in a high drilling temperature, and error.

When sputtering the multiple vertical vias, a sputtering layer cannot be sputtered on inner walls of the multiple vertical vias completely and are sputtered to a roller, thus dropping sputtering ions and having adhesion of dusts on the roller.

The present invention has arisen to mitigate and/or obviate the afore-described disadvantages.

SUMMARY OF THE INVENTION

One aspect of the present invention is to provide a double-sided and multilayer FPC substrate and a method of processing the same which are capable of eliminating at least one metal layer from the body so as to reduce a processing cost, drill the body in a low laser energy and in a high speed, and obtain a high processing accuracy.

Further aspect of the present invention is to provide a double-sided and multilayer FPC substrate and a method of processing the same by which the sputter ions are sputtered on the inner wall of the respective tilted via completely but are not sputtered to the roller, thus avoiding adhesion of dusts on the respective tilted via.

To obtain the above aspects, a double-sided and multilayer flexible printed circuit (FPC) substrate provided by the present invention contains: a body, multiple tilted vias passing through the body, a sputtering layer, multiple conductive portions, and multiple copper circuit layers. The sputtering layer is adhered on the body and the multiple tilted vias. A respective conductive portion is formed in a respective titled via and is connected with the sputtering layer. The multiple copper circuit layers are located on a top and a bottom of the body and are connected with the sputtering layer, and the multiple copper circuit layers are connected via the multiple conductive portions.

Preferably, a vertical cross section of a respective tilted via is obliquely columnar.

Preferably, an orthographic projection of a top opening of the respective tilted via does not intersect with an orthographic projection of a bottom opening of the respective tilted via, and a straight distance between the orthographic projection of the top opening and the orthographic projection of the bottom opening is not greater than a longest chordal distance of the orthographic projection of the top opening.

Preferably, a periphery of an orthographic projection of a top opening of the respective tilted via is tangent with a periphery of an orthographic projection of a bottom opening of the respective tilted via.

Preferably, the body is a polyimide (PI) film.

A method of making the double-sided and multilayer flexible printed circuit (FPC) substrate of the present invention contains steps of:

S1) forming the multiple tilted vias on the body;
S2) cleaning the multiple tilted vias;
S3) sputtering the conductive layer on an inner wall of the respective tilted via and the top and the bottom of the body; and
S4) electroplating the body and the multiple tilted vias so as to increase thicknesses of the body and the multiple tilted vias, form the multiple conductive portions in the multiple tilted vias, locate the multiple copper circuit layers on the top and the bottom of the body, and conduct the top and the bottom of the body by using the multiple copper circuit layers.

Preferably, in the step S3), a part of the inner wall of the respective tilted via and the top or the bottom of the body are sputtered to form a part of the sputtering layer, and the other part of the inner wall of the respective tilted via and the bottom or the top of the body are sputtered to form the other part of the sputtering layer.

Preferably, in the step S4), the inner wall of the respective tilted via and the top and the bottom of the body are electroplated simultaneously.

Preferably, the multiple tilted vias are cleaned in a Plasma manner or in a Desmear manner.

Preferably, the respective tilted via is laser formed on the body.

DETAILED DESCRIPTION OF THE PREFERRED EMBODIMENTS

Figure 1:
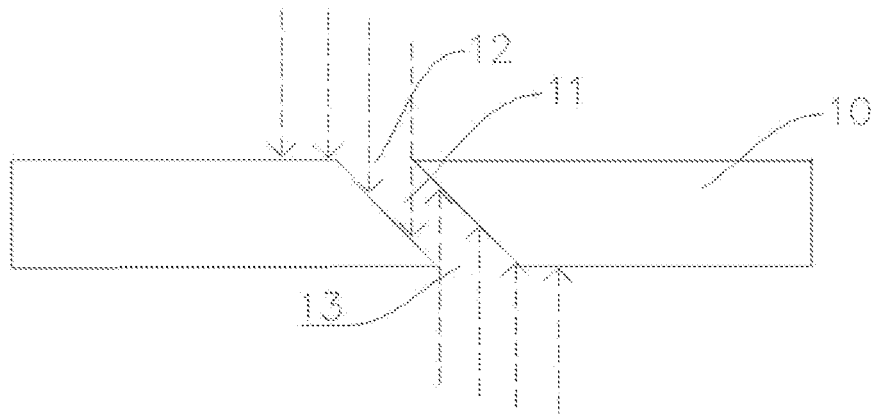
FIG. 1 is a side plan showing the assembly of a double-sided and multilayer flexible printed circuit (FPC) substrate according to a first embodiment of the present invention.

With reference to FIG. 1, a double-sided and multilayer flexible printed circuit (FPC) substrate according to a first embodiment of the present invention comprises:

a body 10 through which multiple tilted vias 11 pass, wherein a vertical cross section of a respective tilted via 11 is obliquely columnar, an orthographic projection of a top opening 12 of the respective tilted via 11 does not intersect with an orthographic projection of a bottom opening 13 of the respective tilted via 11, a straight distance between the orthographic projection of the top opening 12 and the orthographic projection of the bottom opening 13 is not greater than a longest chordal distance of the orthographic projection of the top opening 12, and the body 10 is a polyimide (PI) film;

a sputtering layer 1 adhered on the body 10 and the multiple tilted vias 11;

multiple conductive portions (not shown), wherein a respective conductive portion (not shown) is formed in the respective titled via 11 and connected with the sputtering layer 1; and multiple copper circuit layers 2 located on a top and a bottom of the body 10 and connected with the sputtering layer 1, wherein the multiple copper circuit layers are connected via the multiple conductive portions.

Figure 3:
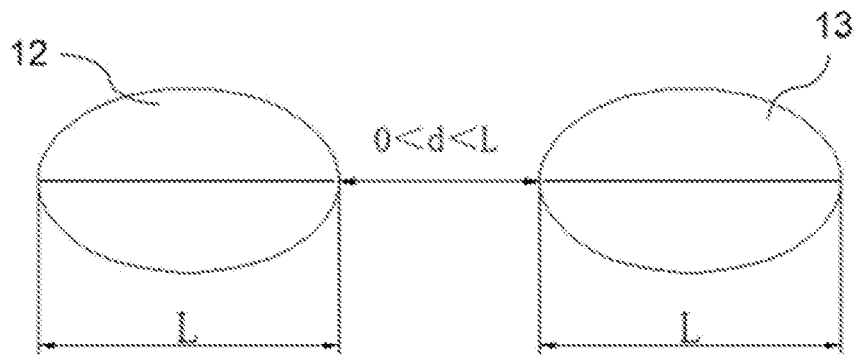
FIG. 3 is a perspective view showing multiple tilted vias of the FPC substrate being formed according to the first embodiment of the present invention.
Figure 4:
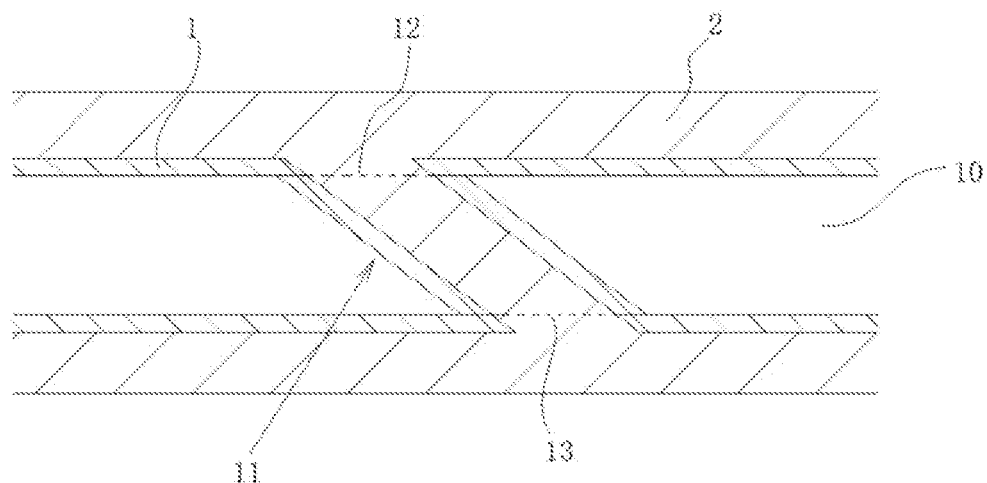
FIG. 4 is a perspective showing the assembly of the double-sided and multilayer FPC substrate according to the first embodiment of the present invention.

When the orthographic projection of the top opening 12 of the respective tilted via 11 does not intersect with the orthographic projection of the bottom opening 13 of the respective tilted via 11 and the straight distance between the orthographic projection of the top opening 12 and the orthographic projection of the bottom opening 13 is not greater than the longest chordal distance of the orthographic projection of the top opening 12, as shown in FIGS. 1 and 3, the longest chordal distance of the orthographic projection of the top opening 12 is L, and a longest chordal distance of the orthographic projection of the bottom opening 13 is L, wherein the straight distance between the orthographic projection of the top opening 12 and the orthographic projection of the bottom opening 13 is d, thus, $0<d\leq L$. In a sputtering process, sputter ions are not sputtered onto an inner wall of the respective tilted via 11, and the inner wall of the respective tilted via 11 is electroplated so as to sputter two conductive layers on the top and the bottom of the body 10.

The multiple tilted vias 11 pass through the body 10. Since the body 10 does not have at least one copper foil layer, it is easy to be drilled, thus reducing a processing cost and laser energy requirement and avoiding deformation and error after drilling the body. After cleaning the respective tilted via, the sputter ions are sputtered on the inner wall of the respective tilted via and the body, but the sputter ions are not sputtered to a roller from the respective tilted via.

Figure 2:
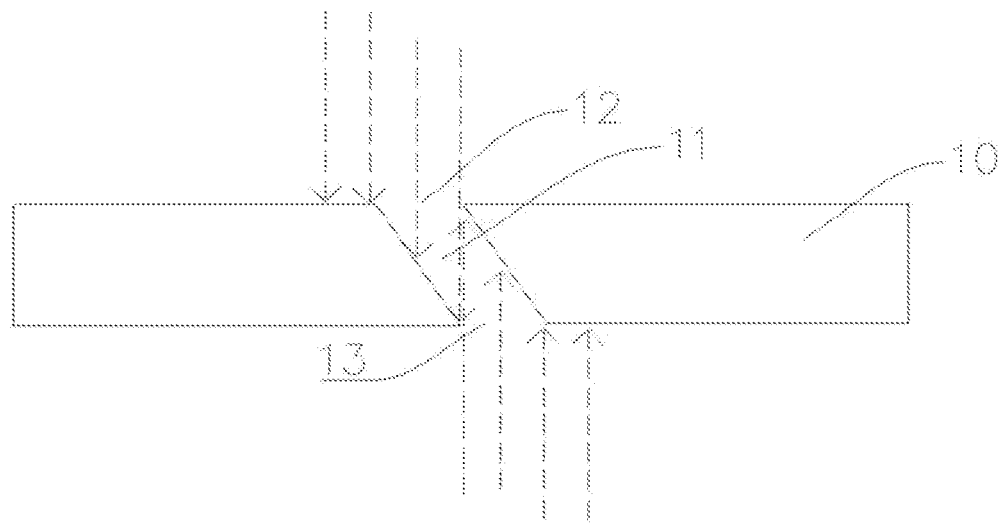
FIG. 2 is a side plan showing the assembly of a double-sided and multilayer flexible printed circuit (FPC) substrate according to a second embodiment of the present invention.

Referring to FIG. 2, a difference of a double-sided and multilayer flexible printed circuit (FPC) substrate of a second embodiment of the present invention from that of the first embodiment comprises:

a periphery of the orthographic projection of the top opening 12 of the respective tilted via 11 being tangent with a periphery of the orthographic projection of the bottom opening 13 of the respective tilted via 11.

When the periphery of the orthographic projection of the top opening 12 of the respective tilted via 11 is tangent with the periphery of the orthographic projection of the bottom opening 13 of the respective tilted via 11, the sputter ions are not sputtered on the roller from the respective tilted via but are sputtered on the inner wall of the respective tilted via completely.

A method of processing the double-sided and multiple layer FPC substrate according to the present invention comprises steps of:

S1) forming the multiple tilted vias on the body 10, wherein the respective tilted via passes through and is laser formed on the body 1;

S2) cleaning the multiple tilted vias 11, wherein the multiple tilted vias 11 are cleaned in a Plasma manner or in a Desmear manner;

S3) sputtering the conductive layer on the inner wall of the respective tilted via 11 and the top and the bottom of the body 10, wherein a part of the inner wall of the respective tilted via and the top or the bottom of the body 10 are sputtered to form a first conductive layer, and the other part of the inner wall of the respective tilted via and the bottom or the top of the body 10 are sputtered to form a second conductive layer; and S4) electroplating the body 10 so as to increase a thickness of the body 10, wherein the multiple copper circuit layers 2 are located on the top and the bottom of the body 10, and the top and the bottom of the body 10 are conductive by using the multiple copper circuit layers, wherein the inner wall of the respective tilted via 11 and the top and the bottom of the body 10 are electroplated simultaneously.

Thereby, the double-sided and multilayer FPC substrate and the method of processing the same have advantages as follows:

At least one metal layer is eliminated from the body 10 so as to reduce the processing cost, drill the body in the low laser energy and in a high speed, and obtain a high processing accuracy. The sputter ions are sputtered on the inner wall of the respective tilted via completely but are not sputtered to the roller, thus avoiding adhesion of dusts on the respective tilted via.

While the preferred embodiments of the invention have been set forth for the purpose of disclosure, modifications of the disclosed embodiments of the invention as well as other embodiments thereof may occur to those skilled in the art. The scope of the claims should not be limited by the preferred embodiments set forth in the examples, but should be given the broadest interpretation consistent with the description as a whole.

What is claimed is:

1. A double-sided and multilayer flexible printed circuit (FPC) substrate comprising:

a body through which multiple tilted vias pass;

a sputtering layer adhered on the body and the multiple tilted vias;

multiple copper circuit layers located on a top and a bottom of the body and connected with the sputtering layer, wherein the multiple copper circuit layers are connected;

wherein a vertical cross section of a respective tilted via is obliquely columnar;

wherein an orthographic projection of a top opening of the respective tilted via does not intersect with an orthographic projection of a bottom opening of the respective tilted via, and a straight distance between the orthographic projection of the top opening and the orthographic projection of the bottom opening is not greater than a longest chordal distance of the orthographic projection of the top opening;

wherein a periphery of an orthographic projection of a top opening of the respective tilted via is tangent with a periphery of an orthographic projection of a bottom opening of the respective tilted via.

2. The double-sided and multilayer flexible printed circuit (FPC) substrate as claimed in claim 1, wherein the body is a polyimide (PI) film.

\* \* \* \* \*